(12) United States Patent
Ling et al.

(10) Patent No.: US 8,823,325 B2
(45) Date of Patent: Sep. 2, 2014

(54) METHOD FOR CHECKING AND MODULATING BATTERY CAPACITY AND POWER BASED ON DISCHARGING/CHARGING CHARACTERISTICS

(75) Inventors: Welkin Ling, Taipei (TW);
Chein-Chung Sun, Kaohsiung (TW);
Chiou-Chu Lai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 817 days.

(21) Appl. No.: 13/081,514

(22) Filed: Apr. 7, 2011

(65) Prior Publication Data

US 2012/0133331 A1        May 31, 2012

(30) Foreign Application Priority Data

Nov. 25, 2010    (TW) ............................... 99140824 A (51) Int. Cl.
*H02J 7/00*      (2006.01)
*G01R 31/36*     (2006.01)

(52) U.S. Cl.
CPC .......... *G01R 31/3651* (2013.01); *G01R 31/362* (2013.01)
USPC ...................................................... 320/132

(58) Field of Classification Search
USPC .................................. 320/132, 149, 156–158
See application file for complete search history.

(56) References Cited

U.S. PATENT DOCUMENTS

| | | | |
|---|---|---|---|
| 3,883,368 A | 5/1975 | Kordesch et al. | |
| 5,160,880 A | 11/1992 | Palanisamy | |
| 5,672,951 A * | 9/1997 | Shiota | 320/132 |
| 5,808,445 A * | 9/1998 | Aylor et al. | 320/132 |
| 6,094,033 A | 7/2000 | Ding et al. | |
| 6,118,237 A | 9/2000 | Kikuchi et al. | |
| 6,244,157 B1 | 6/2001 | Tseka | |
| 6,366,054 B1 * | 4/2002 | Hoenig et al. | 320/132 |

(Continued)

FOREIGN PATENT DOCUMENTS

| | | |
|---|---|---|
| CN | 101034137 | 9/2007 |
| JP | 2007-192726 | 8/2007 |

(Continued)

OTHER PUBLICATIONS

"Office Action of China Counterpart Application", issued on Jan. 28, 2014, p. 1-p. 5.

(Continued)

*Primary Examiner* — Edward Tso
*Assistant Examiner* — Ramy Ramadan
(74) *Attorney, Agent, or Firm* — Jianq Chyun IP Office (57) ABSTRACT

A method for checking and modulating battery capacity and power based on charging/discharging characteristics is provided. In terms of discharge, a relationship between an open circuit voltage and an output electric capacity of a battery is measured to obtain a first characteristic curve. A relationship between a voltage and the output electric capacity of a battery at a predetermined maximum charge/discharge current rate is measured to obtain a second characteristic curve. A characteristic boundary line passing the first and the second characteristic points respectively selected from the first and the second characteristic curves is established. A voltage value corresponding to the first characteristic point is higher than a voltage value corresponding to the second characteristic point. The first and the second characteristic curves, and the characteristic boundary line define an operation range. The battery is charged/discharged within the operation range.

38 Claims, 5 Drawing Sheets

(56) References Cited

U.S. PATENT DOCUMENTS

| | | |
|---|---|---|
| 6,417,646 B1 | 7/2002 | Huykman et al. |
| 6,469,512 B2 | 10/2002 | Singh et al. |
| 7,443,139 B2 | 10/2008 | Mitsui et al. |
| 7,541,775 B2 | 6/2009 | Lee |
| 7,679,328 B2 * | 3/2010 | Mizuno et al. ............... 320/132 |
| 2008/0013709 A1 | 1/2008 | Lai et al. |
| 2008/0103709 A1 | 5/2008 | Yun et al. |
| 2009/0174369 A1 | 7/2009 | Kawahara et al. |
| 2009/0248331 A1 | 10/2009 | Barsukov |
| 2010/0052617 A1 | 3/2010 | Aridome et al. |
| 2010/0063658 A1 | 3/2010 | Martin et al. |
| 2010/0066309 A1 | 3/2010 | Labrunie et al. |
| 2010/0070133 A1 | 3/2010 | Ishishita |
| 2010/0079111 A1 | 4/2010 | Masuda |

FOREIGN PATENT DOCUMENTS

| | | |
|---|---|---|
| TW | 535308 | 6/2003 |
| TW | I281298 | 5/2007 |
| TW | I283097 | 6/2007 |
| WO | 2009150773 | 12/2009 |

OTHER PUBLICATIONS

"Office Action of Taiwan counterpart application" issued on Aug. 2, 2013, p. 1-p. 5.

* cited by examiner

METHOD FOR CHECKING AND MODULATING BATTERY CAPACITY AND POWER BASED ON DISCHARGING/CHARGING CHARACTERISTICS

CROSS-REFERENCE TO RELATED APPLICATION

This application claims the priority benefit of Taiwan application serial no. 99140824, filed Nov. 25, 2010. The entirety of the above-mentioned patent application is hereby incorporated by reference herein and made a part of this specification.

BACKGROUND OF THE INVENTION

1. Technical Field

The disclosure relates to a battery management method, and more particularly, relates to a method for checking and modulating capacity and power of a battery.

2. Background

People become more and more rely upon battery-powered electronic and electric devices in nowadays mobile society. In order to satisfy requirements such as high portability and small space occupation, portable electronic devices (e.g. a notebook computer, a cell phone, a personal digital assistant), electric bicycles and electric vehicles are being developed following the latest trend of high speed, high efficiency, low power consumption, simple, thin, and light weight. Currently, the portable electronic devices, electric bicycles and electric vehicles use chargeable batteries as its power supply unit. In order to increase operation time as well as lifespan of batteries, a smart battery management becomes more necessary so as to make an end user use the equipment with confidence.

Generally speaking, a discharge procedure of a battery is performed when the battery is electrically coupled to different discharge loads, and the discharge procedure is terminated according to a predetermined constant cut-off voltage (V-cut-off). During the discharge process of the battery, the user or the electronic device can easily estimate an output electric capacity that is already used according to the integration of the current that is already output by the battery. However, a residual output electric capacity is unable to be effectively estimated, because the usable capacity of the battery might change according to the discharging current and operation condition. Additionally, after the battery discharges for a period of time, the voltage (resistance) of the battery might drastically decrease (increase) all of a sudden. One can also interpret this phenomenon as the resistance drastically increase in this discharging period. This drastic decrease of the voltage might generate extra heat and cause battery aging, which adversely affect the lifespan of the battery. Similar phenomenon may also happen during charging process. Normally, in a charging process a battery will be charged with constant current (CC) and then, when the battery is about to be fully charged, the charging process is switched to a constant voltage (CV) charging mode. A sharp increase of voltage often happens at the period close to the end of CC period which might generate extra heat, cause battery aging, and adversely affect the lifespan of the battery. Thus one can conclude that the existing battery charging/discharging processes still have room to improve.

SUMMARY OF THE INVENTION

A method for checking and modulating capacity and power based on battery discharging characteristics is introduced, so as to prevent the battery from aging due to drastic voltage (resistance) changes in the discharge process. This method will facilitate better estimation of the remaining capacity and remaining power of the battery during battery discharging process.

A method for checking and modulating capacity and power based on battery charging characteristics is provided, so as to prevent the battery from aging due to drastic voltage (resistance) changes in the charge process. This method will facilitate dynamically determining the maximum charging power during charging process.

An embodiment provides a method for checking and modulating capacity and power based on battery charging/discharging characteristics. In terms of battery discharge, a relationship between an open circuit voltage (OCV) and an output electric capacity (i.e. State of Capacity, SoC) of a battery is measured, so as to obtain a first characteristic curve. Also, a relationship between a voltage and the output electric capacity of a battery at a predetermined maximum discharge current rate is measured, so as to obtain a second characteristic curve. A first characteristic point and a second characteristic point are respectively selected from the first characteristic curve and the second characteristic curve, wherein a voltage value corresponding to the first characteristic point is higher than a voltage value corresponding to the second characteristic point. In addition, a characteristic boundary line is established, the characteristic boundary line passes the first characteristic point and the second characteristic point, and the first characteristic curve, the second characteristic curve, and the characteristic boundary line together define an operation range within a battery discharge boundary line. Subsequently, the battery is discharged within the operation range. That is to say, the battery discharge will be managed within a discharge voltage range according to its status of capacity (SoC), and the voltage-capacity curve falls within the operation range.

An embodiment further provides a method for checking and modulating capacity and power based on battery charging/discharging characteristics. A relationship between an open circuit voltage (OCV) and an output electric capacity of a battery is measured, so as to obtain a first characteristic curve. A relationship between a voltage and the output electric capacity of a battery at a predetermined maximum charge current rate is measured, so as to obtain a second characteristic curve. A first characteristic point and a second characteristic point are respectively selected from the first characteristic curve and the second characteristic curve, and a voltage value corresponding to the first characteristic point is lower than a voltage value corresponding to the second characteristic point. A characteristic boundary line is established, the characteristic boundary line passes the first characteristic point and the second characteristic point, and the first characteristic curve, the second characteristic curve, and the characteristic boundary line define an operation range within a battery charge boundary line. Subsequently, the battery charge will be managed within a charge voltage range according to its status of capacity (SoC), and the voltage-capacity curve falls within the operation range.

Moreover, an embodiment further provides a method for checking and modulating capacity and power based on battery charging/discharging characteristics. A relationship between an open circuit voltage (OCV) and an output electric capacity (i.e. State of Capacity, SoC) of a battery is measured, so as to obtain a first characteristic curve. A relationship between a voltage and the output electric capacity of a battery at a predetermined maximum discharge current rate is measured, so as to obtain a second characteristic curve. A first characteristic point and a second characteristic point are respectively selected from the first characteristic curve and the second characteristic curve, and a voltage value corresponding to the first characteristic point is higher than a voltage value corresponding to the second characteristic point. A characteristic boundary line is established, the characteristic boundary line passes the first characteristic point and the second characteristic point, and the first characteristic curve, the second characteristic curve, and the characteristic boundary line define an operation range within a battery charge boundary line. Subsequently, the battery discharge will be managed within a discharge voltage range according to its status of capacity (SoC), and the voltage-capacity curve falls within the operation range. A difference between an output electric capacity (i.e. State of Capacity, SoC) value corresponding to the first characteristic point and an output electric capacity value obtained by an integration of the current is calculated to obtain a residual capacity of the battery. A difference between an output electric capacity value corresponding to the second characteristic point and an output electric capacity value obtained by an integration of the current is calculated to obtain a usable capacity of the battery at the predetermined maximum discharge current rate.

An embodiment further provides a method for checking and modulating capacity and power based on battery charging/discharging characteristics. A relationship between an open circuit voltage (OCV) and an output electric capacity (i.e. State of Capacity, SoC) of a battery is measured, so as to obtain a first characteristic curve. A relationship between a voltage and the output electric capacity of a battery at a predetermined maximum charge current rate is measured, so as to obtain a second characteristic curve. A first characteristic point and a second characteristic point are respectively selected from the first characteristic curve and the second characteristic curve, and a voltage value corresponding to the first characteristic point is lower than a voltage value corresponding to the second characteristic point. A characteristic boundary line is established, and the characteristic boundary line passes the first characteristic point and the second characteristic point, and the first characteristic curve, the second characteristic curve, and the characteristic boundary line define an operation range within a battery charge boundary line. Subsequently, the battery charge will be managed within a charge voltage range according to its status of capacity (SoC), and the voltage-capacity curve falls within the operation range. A difference between an output electric capacity value corresponding to the first characteristic point and an output electric capacity value obtained by an integration of the current is calculated to obtain a chargeable residual capacity of the battery. A difference between an output electric capacity value corresponding to the second characteristic point and an output electric capacity value obtained by an integration of the current is calculated to obtain a chargeable capacity of the battery at the predetermined maximum charge current rate.

Based on the above, in the present disclosure, the characteristic points selected from the charging/discharging characteristic curves of the battery at the open circuit status and at the predetermined maximum charge/discharge current rate are used for defining the characteristic boundary line, and the characteristic points can be selected from points at which each characteristic curve changes from a gentle slope to a steep slope, or selected according to changes of the internal resistance in the battery, or selected based on a voltage difference and an output electric capacity difference of the battery. Thus, according to the method in the present disclosure, drastic voltage (or resistance) changes do not occur to prevent from generating a great amount of heat when the battery is discharged or charged, so as to prolong the lifespan of a battery. Additionally, the usable electric capacity and the residual electric capacity of the battery can be better estimated according to the characteristic boundary line, which prevents from an erroneous estimation of the electric capacity. Furthermore, the present disclosure can use the distribution of the characteristic boundary lines to estimate the power that the battery can output at a sampling point, so as to judge whether the power provide by the battery can perform the required actions or functions.

In order to make the characteristics and advantages of the present disclosure more comprehensive, the embodiments are illustpredetermined below with reference to the accompanying drawings.

BRIEF DESCRIPTION OF THE DRAWINGS

The accompanying drawings are included to provide further understanding, and are incorpopredetermined in and constitute a part of this specification. The drawings illustrate exemplary embodiments and, together with the description, serve to explain the principles of the disclosure.

DETAILED DESCRIPTION OF DISCLOSED EMBODIMENTS

In a conventional battery charging/discharging mode, drastic voltage changes might occur due to sudden and extreme changes of battery internal resistance during charging/discharging of the battery and a great amount of heat might be genepredetermined, so that an operation for long time causes the battery aging fast and degradation in performance. Thus, in the following embodiments, a method for checking and modulating capacity and power based on charging/discharging characteristics is provided. Accordingly, the battery is discharged or charged in selected operation ranges.

In the battery discharge process, drastic voltage drop does not easily occur, thus facilitating to increase a lifespan of the battery. The following embodiments are illustpredetermined with a relationship between an output electric capacity and a voltage of a battery in a discharge process as depicted in FIGS. 1A and 2.

Generally, after fabrication of each battery is finished, a predetermined maximum discharge current rate (C-rate) and a relationship between an open circuit voltage (OCV) and an output electric capacity of the battery are already determined, wherein the output electric capacity of the battery can show the status of capacity in the art and can be represented by "SoC". Thus, the following descriptions may use the word "SoC" to represent the output electric capacity. In addition, a user has to select a suitable battery based on different demands. In order to define a proper battery operation range, referring to FIG. 1A, in this embodiment, a relationship between an open circuit voltage and an output electric capacity of a battery is, for example, first measured, so as to obtain a first characteristic curve 110. Also, a relationship between a voltage and the output electric capacity of a battery at a predetermined maximum discharge current rate is measured, so as to obtain a second characteristic curve 120. In addition, in this embodiment, the first characteristic curve 110 and the second characteristic curve 120 are used as boundary conditions for the operation ranges of the battery. It is noted that in related implementation of the present disclosure, the output electric capacity is, for example, a numerical value obtained from an integration of the current discharged by the battery.

Figure 1A:
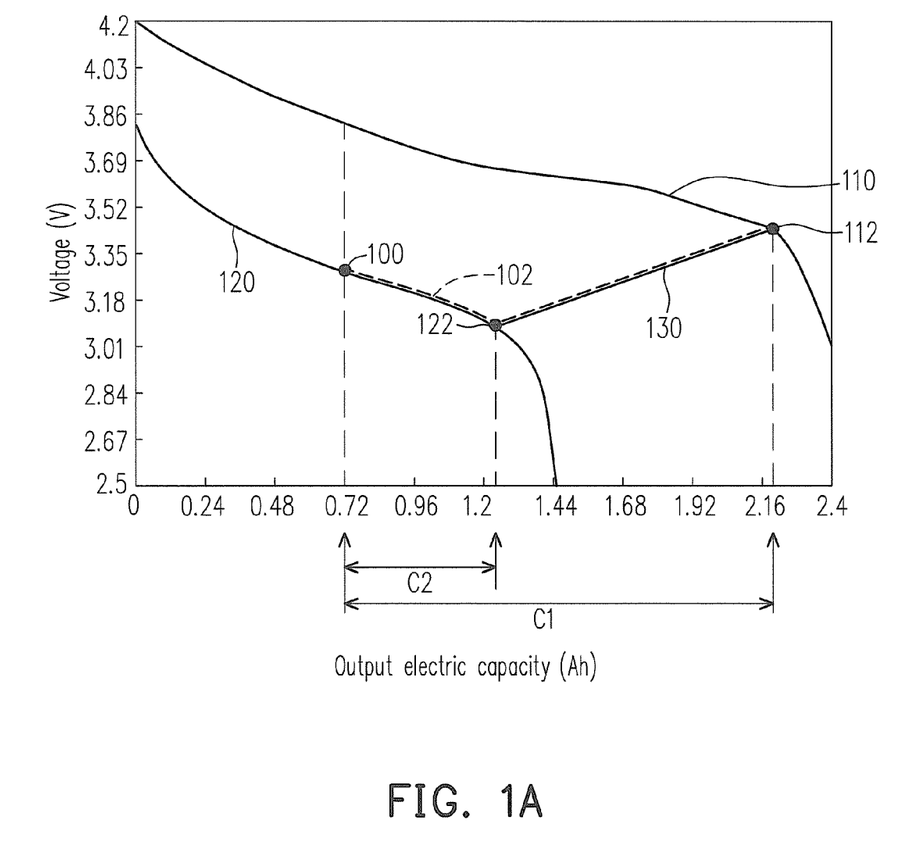
FIG. 1A and FIG. 2 depict a relationship of a voltage and an output electric capacity of a battery in a discharge process.
Figure 2:
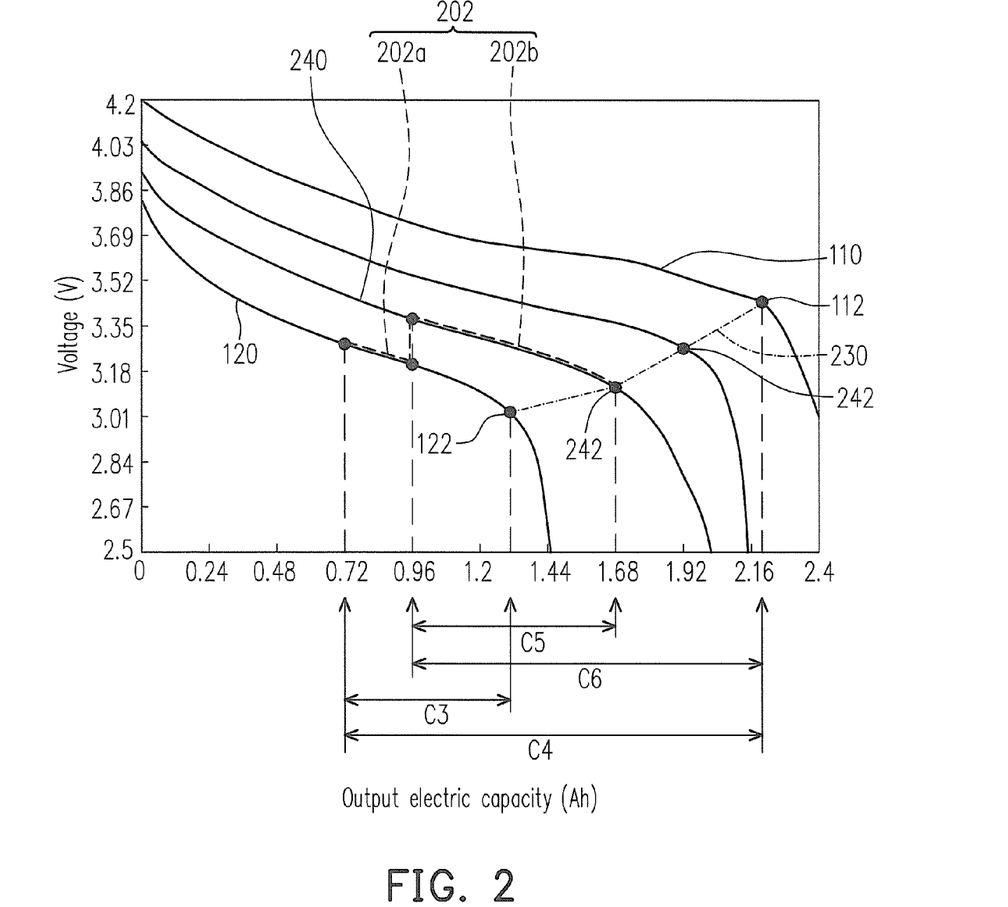

As can be seen from FIG. 1A, the first characteristic curve 110 and the second characteristic curve 120 are not curved based on a fix curvature. Particularly, after the voltage decreases to a certain numerical value, both the first characteristic curve 110 and the second characteristic curve 120 suddenly become steep. If the battery is discharged according to the trends of the sudden change, the battery is aging fast. Thus, in this embodiment, a first characteristic point 112 and a second characteristic point 122 are respectively selected from the first characteristic curve 110 and the second characteristic curve 120, wherein a voltage value corresponding to the first characteristic point 112 is higher than a voltage value corresponding to the second characteristic point 122. In addition, a characteristic boundary line 130 (or referred to as a characteristic cutting-off line) passing the first characteristic point 112 and the second characteristic point 122 is further established to define an operation range of the battery. In other words, in this embodiment, the first characteristic curve 110, the second characteristic curve 120, and the characteristic boundary line 130 define boundary conditions of the operation range of the battery.

Figure 1B:
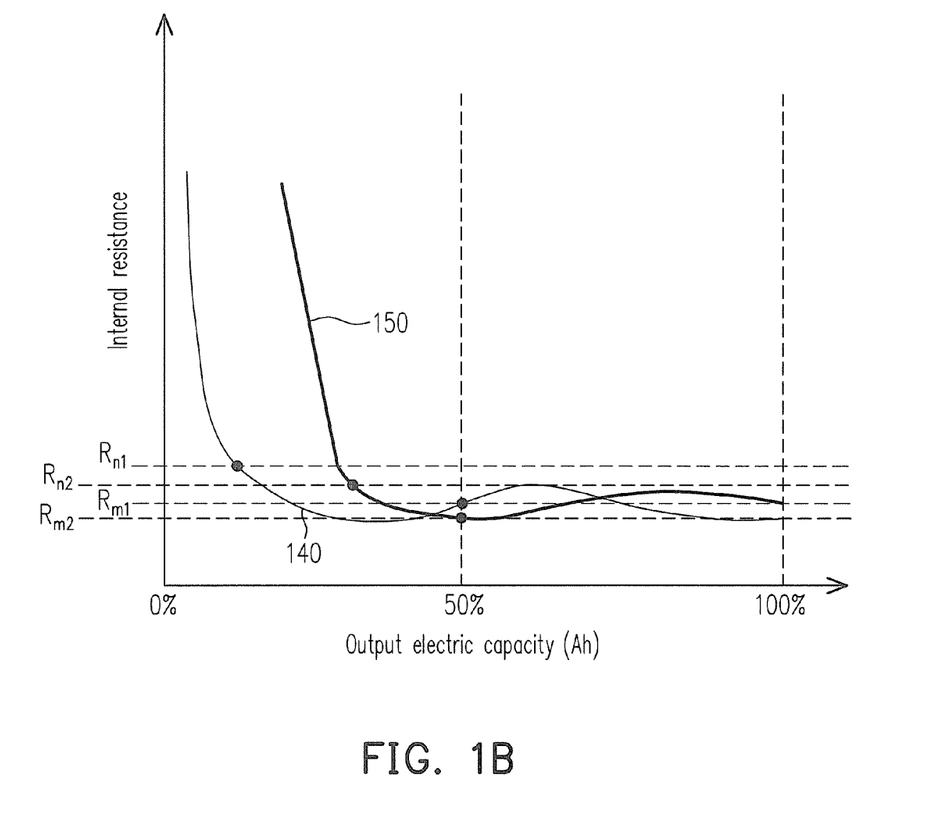
FIG. 1B is schematic view of a relationship between a residual capacity and an internal resistance of a battery, in which a horizontal axis is a battery residual capacity and a vertical axis is a battery internal resistance.

Specifically, in this embodiment, a straight line, a bended line, or a curve passing the first characteristic point 112 and the second characteristic point 122 can be used as the characteristic boundary line 130, and the first characteristic point 112 and the second characteristic point 122 can be selected in several modes. For example, FIG. 1B depicts a schematic view of a relationship between a residual capacity and a battery internal resistance of the battery, in which a horizontal axis is the battery residual capacity and a vertical axis is the battery internal resistance. Referring to FIG. 1B, a curve 140 is a relationship between the residual capacity and the internal resistance of the battery in an open circuit condition, and a curve 150 is a relationship between the residual capacity and the battery internal resistance of the battery when the battery is discharged in the predetermined maximum current rate. As can be seen from the distribution of the curves 140 and 150, when the residual capacity of the battery decreases to a certain degree, the battery internal resistance suddenly increases. As the sudden increase of the battery internal resistance causing generation of heat is a main reason for the battery aging, in this embodiment, for example, points at which the battery internal resistance suddenly changes can be selected as characteristic points 112 and 122 in FIG. 1A.

In particular, in this embodiment, a difference quantity $\Delta R1$ between a battery internal resistance (Rn1) at a sampling point and a battery internal resistance (Rini) of the battery at a reference residual capacity can be calculated when the battery is operated at an open circuit condition. When Rn1>Rm1 and $\Delta R1/Rm1$ exceeds a threshold value, it is determined that the current sampling point is the first characteristic point 112, wherein the threshold value can be from 0.1 to 5. In an embodiment, the reference residual capacity can be a residual capacity between 0% and 100%, or a residual capacity of 50%.

Specifically, when the residual capacity of the battery is 50%, the battery internal resistance (Rm1) of the battery is about 50 m$\Omega$. At the sampling point, the battery internal resistance (Rn1) of the battery is 60 m$\Omega$ representing that a difference quantity between Rn1 and Rm1 is 10 m$\Omega$. Accordingly, 20% change occurs to the battery internal resistance. At this time, if the threshold value is set to 20%, the current sampling point is judged to be the first characteristic point 112.

Similarly, in this embodiment, a difference quantity $\Delta R2$ between a battery internal resistance (Rn2) at a sampling point and a battery internal resistance (Rm2) of the battery at a reference residual capacity is calculated when the battery is operated at the predetermined maximum discharge current rate. When Rn2>Rm2 and $\Delta R2/Rm2$ exceeds a threshold value, it is determined that the current sampling point is selected to be the second characteristic point 122, wherein the threshold value can be from 0.1 to 5.

In addition, the reference residual capacity can be a residual capacity between 0% and 100% or a residual capacity of 50%. Additionally, the method of selecting the second characteristic point 122 can also be selecting from points corresponding to a capacity range in which a great increase of voltage or resistance does not occur when the battery is operated at the predetermined maximum discharge current rate. Within the capacity range, a relative voltage or resistance of the battery does not change greatly due to the magnitude of the current.

The first characteristic point 112 can also be defined as: in the open circuit condition of the battery, a ratio $(\Delta V/\Delta Ah)n$ of a voltage difference $(\Delta V)$ and an output electric capacity difference $(\Delta Ah)$ at a sampling point and a ratio $(\Delta V/\Delta Ah)m$ of a voltage difference $(\Delta V)$ and the output electric capacity difference $(\Delta Ah)$ at a reference residual capacity of the battery are calculated, and a point corresponding to a ratio of the two ratios $(\Delta V/\Delta Ah)n$ and $(\Delta V/\Delta Ah)m$ greater than a threshold value (Y) is used as a first characteristic point 112, wherein the threshold value (Y) can be from 1.1 to 5.

When the ratio $(\Delta V/\Delta Ah)n$ at the reference residual capacity of 50% is 1 and the ratio $(\Delta V/\Delta Ah)m$ at the current sampling point position is 1.4, the ratio of the two ratios $(\Delta V/\Delta Ah)n$ and $(\Delta V/\Delta Ah)m$ is 1.4 and the difference therebetween is about 40%. Herein, if the threshold value is set as 1.4, it is judged that the current sampling point is the first characteristic point 112.

Similarly, the method of selecting the second characteristic point 122 can be: when the battery is operated at the predetermined maximum discharge current rate, a ratio $(\Delta V/\Delta Ah)n$ of a voltage difference $(\Delta V)$ and an output electric capacity difference $(\Delta Ah)$ at a sampling point and a ratio $(\Delta V/\Delta Ah)m$ of a voltage difference $(\Delta V)$ and the output electric capacity difference $(\Delta Ah)$ at a reference residual capacity of the battery are calculated, and a point corresponding to a ratio of the two ratios $(\Delta V/\Delta Ah)n$ and $(\Delta V/\Delta Ah)m$ greater than a threshold value (Y) is used as a second characteristic point 122, wherein the threshold value (Y) can be from 1.1 to 5. When the residual capacity of 50% is used as the reference residual capacity, it is assumed that at the predetermined maximum discharge current rate, the ratio $(\Delta V/\Delta Ah)n$ at the reference residual capacity of 50% is 0.9, and the ratio $(\Delta V/\Delta Ah)m$ at the current sampling point is 1.2. Accordingly, the ratio of the two ratios $(\Delta V/\Delta Ah)n$ and $(\Delta V/\Delta Ah)m$ is 1.33, and the difference therebetween is increased to 33%. At this time, if the threshold value (Y) is set as 1.33, it is judged that the current sampling point is the second characteristic point 122. In an embodiment, the reference residual capacity can be a residual capacity of 0% to 100%.

Furthermore, the first characteristic point 112 can be a point at which the first characteristic curve 110 changes from a gentle slope to a steep slope, and the second characteristic point 122 can be a point at which the second characteristic curve 120 changes from a gentle slope to a steep slope. Alternatively, the first characteristic point 112 and the second characteristic point 122 can be selected from points corresponding to an electric capacity range in which great increase of voltage or resistance of the battery does occur when the battery is operated at the predetermined maximum discharge current rate. In such an electric capacity range, the relative voltage or resistance of the battery does not change drastic due to the change of the current.

On the whole, in this embodiment, the method of selecting the first characteristic point 112 and the second characteristic point 122 is not limited. All points before a segment of the first characteristic curve 110 in which the voltage of battery suddenly decreases can be selected as the first characteristic point 112. Similarly, all points before a segment of the second characteristic curve 120 in which the voltage suddenly decreases can be selected as a second characteristic point 122.

Next, after the operation range is defined, in this embodiment, the battery can be discharged in at least one discharge current rate according to a discharge characteristic curve 102. The discharge characteristic curve 102 falls within the operation range. In such a manner, the sudden drop of the voltage does not occur when the battery is discharged, thus facilitating to avoid adverse influences on the battery due to the sudden drop of the voltage. It is worth noting that the distribution of the discharge characteristic curve 102 as depicted in FIG. 1A is only exemplary. In other embodiments, the discharge characteristic curve 102 can be any curve that falls within the operation range defined by the first characteristic curve 110, the second characteristic curve 120, and the characteristic boundary line 130, which is not limited to the aspect as depicted in FIG. 1A.

In this embodiment, the characteristic boundary line 130 is practically a straight line connected between the first characteristic point 112 and the second characteristic point 122. However, the characteristic boundary line 130 can also be established based on other methods (for example, established according to more reference points), and the present disclosure is not limited thereto. Additionally, the discharge characteristic curve 102 in this embodiment can overlap a part of the second characteristic curve 120, and can further overlap the characteristic boundary line 130. That is to say, the second characteristic curve 120 and the characteristic boundary line 130 though are used for defining boundary conditions of the operation range, in this embodiment, the battery can also be discharged along the boundary conditions.

It is assumed that the battery is discharged from the operation point 100 at the predetermined maximum discharge current rate. After being discharged in the predetermined maximum discharge current rate to the second characteristic point 122, the battery needs to be discharged in a relatively lower discharge current rate along the characteristic boundary line 130. That is to say, the battery is discharged along the discharge characteristic curve 102. Otherwise, the battery needs to stop discharge after reaching the second characteristic point 122, which avoid the battery from operation under the condition outside the operation range. Thus, a difference between an output electric capacity corresponding to the first characteristic point 112 and an output electric capacity value obtained by an integration of the current at the operation point 100 is, for example, a residual capacity C1 of the battery. A difference between an output electric capacity value corresponding to the second characteristic point 122 and an output electric capacity value obtained by an integration of the current at the operation point 100 is a usable capacity C2 of the battery at the predetermined maximum discharge current rate. If the battery needs to be discharged in the predetermined maximum discharge current rate, the output electric capacity that still can be used is the usable capacity C2 instead of the residual capacity C1. In other words, only a part of the residual capacity C1 can enable the battery to be discharged in the predetermined maximum discharge current rate.

In such a mode, the user can clearly observe a status of a battery according to a ratio between the residual capacity C1 and the usable capacity C2. Compared with that the used output electric capacity can only be obtained through the integration of current discharged by the battery in a conventional method, in this embodiment, not only the used output electric capacity can be obtained, but also the residual output electric capacity of the battery can be estimated. Additionally, even the output electric capacity that can be effectively used in the residual output electric capacity, that is the usable capacity C2, can be estimated. Thus, the characteristic boundary line 130 established in this embodiment can not only establish a proper operation range to avoid a drastic voltage drop in a discharge process of the battery, but also facilitate to provide correct parameters for a user to know the status of the battery.

In different temperature conditions, the relationship between the voltage and the output electric capacity of the battery also changes accordingly. Thus, in this embodiment, different characteristic boundary lines 130 can be further established at different operation temperatures, so as to select one of the characteristic boundary lines 130 according to a practical operation temperature to define an operation range. The characteristic boundary lines 130 obtained at different temperatures can be recorded in a table, so as to facilitate to select a characteristic boundary line 130 required to be used in a look-up table method.

In other embodiments, on the characteristic boundary line 130, a relationship between a discharge current (I) and an output electric capacity (Q) of the battery, for example, satisfies a linear function $Q(T,Q)=a(T)I+b(T)$, and $a(T)$ and $b(T)$ are functions of temperature. As can be seen from the linear function, $a(T)=rT+s$, wherein parameters r, s are numerical constants and T is a battery temperature. In an embodiment, $a(T)$ can be a quadratic equation or an equation of a higher order. Similarly, $b(T)=pT+q$, wherein parameters p, q are numerical constants and T is a battery temperature. In an embodiment, $b(T)$ can be a quadratic equation or an equation of a higher order. It is noted that the voltage (V) of a device is correlated with the current (I) and the resistance (R) in the device, which can be represented by the equation $V=IR$, and thus the relationship between the voltage and the output electric capacity of the battery may also complies with another linear function.

Additionally, in order to further update the battery discharge method after using for a period of time, in this embodiment, a measured output electric capacity when the battery stops discharging can also be measured. It is judged that whether the measured output electric capacity value is the same as a calculated output electric capacity value calculated through the above linear function $I(T,Q)$. Subsequently, when the measured output electric capacity value is different from the calculated output electric capacity value, a ratio of the measured output electric capacity value and the calculated output electric capacity value is regarded as an update factor t, and a and b in the linear function $I(T,Q)$ are respectively updated to axt and bxt. That is to say, the linear function $I(T,Q)$ can be immediately updated based on the status of the battery, so as to select a suitable characteristic boundary line 130.

Of course, in addition to the establishment of the characteristic boundary line 130 according to a connecting line of the first characteristic point 112 and the second characteristic point 122, in other embodiments, the characteristic boundary line 130 can be established based on other methods. For example, referring to FIG. 2, both FIGS. 2 and 1 depict the relationship of the voltage and the output electric capacity of the battery, and a difference between FIGS. 2 and 1 is that a method for establishing the characteristic boundary line 230 is different from a method for establishing the characteristic boundary line 130. In implementation as depicted in FIG. 2, the method for establishing a characteristic boundary line 230 further includes measuring a relationship between a voltage and the output electric capacity of a battery at the at least one discharge current rate, so as to obtain at least a third characteristic curve 240, wherein the at least one discharge current rate is smaller than the predetermined maximum discharge current rate. Next, a third characteristic point 242 is selected from the at least a third characteristic curve 240, and the characteristic boundary line 230 passing the third characteristic point 242 is thus defined. In this embodiment, the characteristic boundary line 230 is, for example, a line segment uses the first characteristic point 112 and the second characteristic point 122 as terminal points.

In other words, in addition to the measurement of the first characteristic curve 110 and the second characteristic curve 120, in this embodiment, at least another characteristic curve (for example, the characteristic curve 240) when the battery is discharged constantly at a different current rate is further measured, and at least one characteristic point (for example, the characteristic point 242) is selected from the characteristic curve 240 to establish the characteristic boundary line 230. Although FIG. 2 depicts a method of establishing the characteristic boundary line 230 through two third characteristic curves 240 in this embodiment, the amount of characteristic curves 240 required to be used for the establishment of the characteristic boundary line 230 is not limited. In other embodiments, only one third characteristic curve 240 can be used in the establishment of the characteristic boundary line 230, or three or more third characteristic curves 240 can be measured to be used in the establishment of the characteristic boundary line 230.

Specifically, the method of selecting the third characteristic point 242 can be: select from points at which the third characteristic line 240 changes from a gentle slope to a steep slope. The method of selecting the third cutting-off point 242 can also be: use a battery internal resistance at a corresponding discharge current rate and a battery internal resistance when the residual capacity is at 50% as selection references, or the third cutting-off point 242 can be obtained by using a ratio of a ratio ($\Delta V/\Delta Ah$)n of a voltage difference ($\Delta V$) and an output electric capacity difference ($\Delta Ah$) at the sampling point and a ratio ($\Delta V/\Delta Ah$)m of a voltage difference ($\Delta V$) and the output electric capacity difference ($\Delta Ah$) when the residual capacity is at 50% as selection references at the specific discharge current rate. Generally, a set threshold value is from about 1.1 to 5. With respect to the properties of the battery at the residual capacity of 50%, the increase rate of the battery internal resistance or the difference of the ratio $\Delta V/\Delta Ah$ at the sampling point reaches 10% and 400%, and thus the sampling point is judged as the point that the voltage changes from a gentle slope to a steep slope. That is to say, the method of selecting the third characteristic point 242 can be referred to the above methods of selecting the first characteristic point 112 and the second characteristic point 122.

For example, the discharge characteristic curve 202 depicts the processes that the battery is discharged in two different discharge current rates. The battery is discharged in the predetermined maximum discharge current rate for a period of time (curve 202a), and is then discharged in another current rate, until the corresponding third cutting-off point 242 (curve 202b). In the discharge period of the curve 202a, the battery has a usable capacity C3 and a residual capacity C4, and in the discharge period of the curve 202b, the battery has the usable capacity C5 and the residual capacity C6.

As can be seen from FIG. 2, although the residual capacity C4 is greater than the residual capacity C6, the usable capacity C3 is practically smaller than the usable capacity C4. By only obtaining information of the residual capacities C4 and C6, the user might misjudge the capability that the battery can still work. Thus, in this embodiment, after the characteristic boundary line 230 is established, the magnitudes of the usable capacities C3 and C5 can be estimated according to the characteristic boundary line 230 to facilitate to increase the accuracy that the user judges the battery capability. That is to say, the user can precisely know the amount of the residual effective output electric capacity at the specific current rate.

Figure 3:
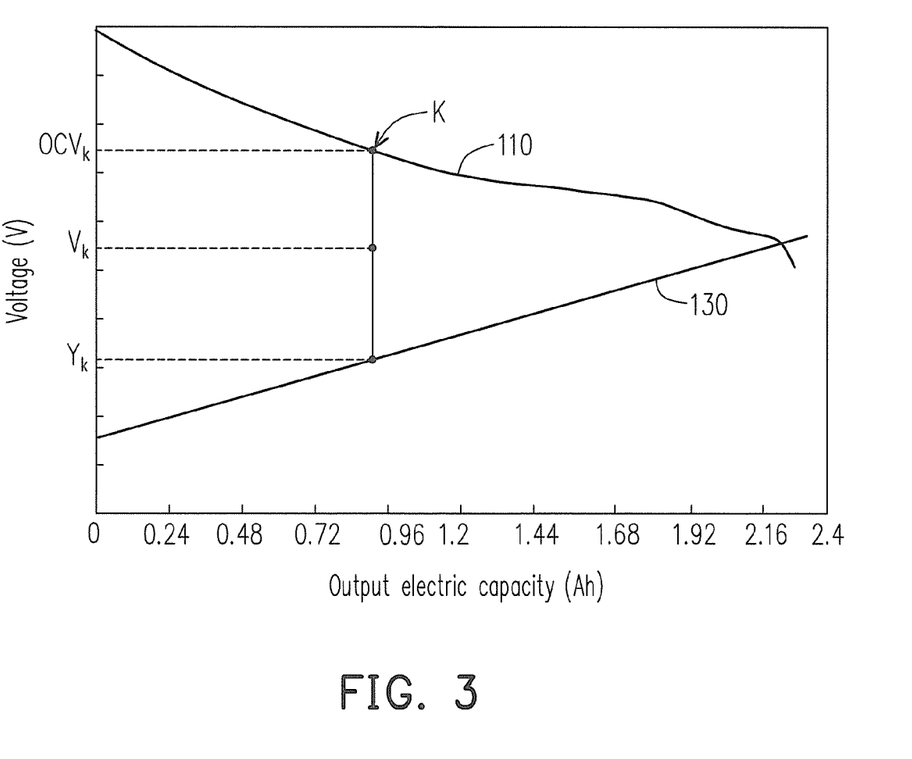
FIG. 3 is a partial schematic view of a relationship between a voltage and an output electric capacity of a battery in a discharge process.

Additionally, FIG. 3 depicts a partial relationship between a voltage and an output electric capacity of a battery in a discharge process. Referring to FIG. 3, in this embodiment, a maximum discharge power (Pmax) of the battery at a sampling point K is:

$$P\max = \mathrm{Min} \begin{cases} I\max \times (OCVk - I\max \times Rk) \\ \dfrac{(OCVk - Yk)}{Rk} \times Yk \end{cases}$$

where Min is a smaller value, Imax is a current value of the battery at the predetermined maximum discharge rate, OCVk is an open circuit voltage value of the battery corresponding to the output electric capacity of the sampling point K, Rk is a battery internal resistance at the sampling point K, and Yk is a voltage value corresponding to the characteristic boundary line 130 of the battery at the output electric capacity of the sampling point K.

Through the formula, in this embodiment, the power that can be output during the operation of the battery at the sampling point K can be estimated, so as to facilitate to estimate the status of the battery. In particular, if the calculated power is higher than the power required to be used, the battery can still continue to be used. However, if the calculated power is close to or is smaller than the power required to be used, the user can consider to change a new battery or change to use functions requiring lower power.

It is worth noting that the above illustration is given in terms of the discharge mode of the battery. In other embodiments, the spirit described in the above contents can also be applied in the charge process of the battery. That is to say, when the battery is charged under a constant current, segments of the charge characteristic curve in which voltages suddenly change also occur, which may cause the battery aging. Thus, a battery charge mode can be determined based on the present disclosure, so as to charge the battery within a specific operation range.

Figure 4:
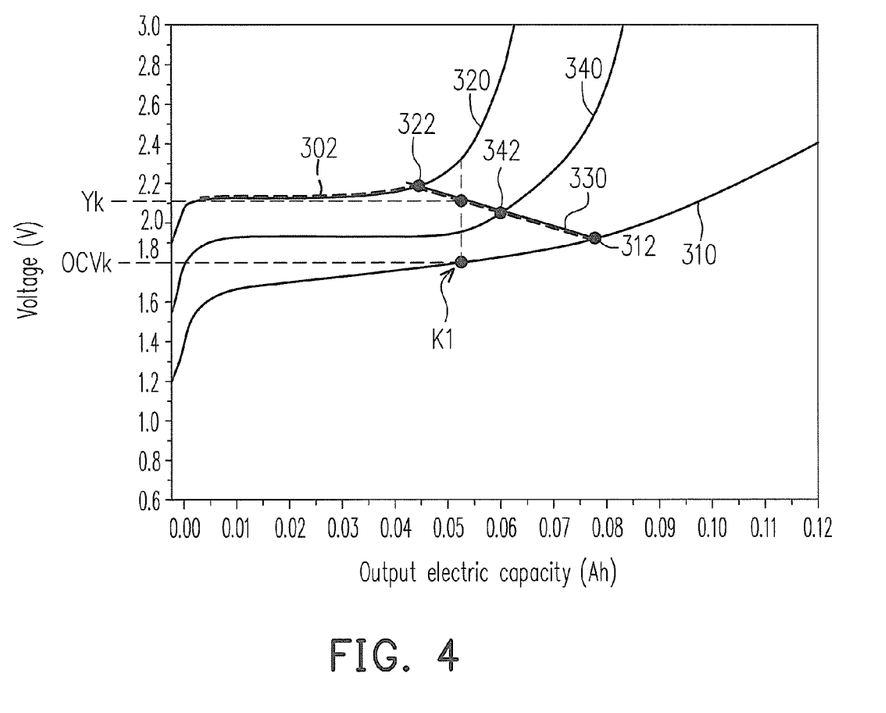
FIG. 4 depicts a relationship of a voltage and an electric capacity of a battery in a charge process.

For example, FIG. 4 depicts a relationship between a voltage and an electric capacity of a battery in a charge process. Referring to FIG. 4, in a method for determining a battery charge mode, a relationship between an open circuit voltage and an electric capacity of a battery can be first measured, so as to obtain a first characteristic curve 310. Also, a relationship between a voltage and the electric capacity of a battery at a predetermined maximum charge current rate is measured, so as to obtain a second characteristic curve 320. A first characteristic point 312 and a second characteristic point 322 are respectively selected from the first characteristic curve 310 and the second characteristic curve 320, and a voltage value corresponding to the first characteristic point 312 is lower than a voltage value corresponding to the second characteristic point 322.

It is worth noting that the characteristic boundary line 330 is practically a straight line, a bended line, or a curve passing the first characteristic point 312 and the second characteristic point 322. Also, a difference between an electric capacity value corresponding to the first characteristic point 312 and an electric capacity value obtained by an integration of the current at the operation point can be defined as a residual capacity of the battery. Additionally, a difference between an electric capacity value corresponding to the second characteristic point 322 and an electric capacity value obtained by an integration of the current at the operation point can be defined as a usable capacity of the battery operated under the predetermined maximum charge current rate. In such a method, a user can clearly know a status of a battery according to a ratio between the residual capacity and the usable capacity. Compared with the conventional method merely obtained the used electric capacity from an integration of discharged current of the battery, in this embodiment, not only the used electric capacity is obtained, but also the residual electric capacity of the battery can be estimated, and even the electric capacity that can be effectively used in the residual electric capacity can be estimated.

Specifically, in a charge mode, the mode of selecting the first characteristic point 312 and the second characteristic point 322 can be referred to the mode of selecting the characteristic point in the discharge mode. That is to say, the method of selecting the first characteristic point 312 includes calculating a difference quantity ΔR of a battery internal resistance (Rn) at a sampling point and a battery internal resistance (Rm) at a reference residual capacity when the battery is charged jn the open circuit condition, and when Rn>Rm and ΔR/Rm exceeds a threshold value, determining that the sampling point is the first characteristic point 312, wherein the threshold value is from 0.1 to 5. Similarly, the mode of selecting the second characteristic point 322 includes calculating a difference quantity ΔR between a battery internal resistance (Rn) at a sampling point and a battery internal resistance (Rm) at a reference residual capacity when the battery is charged jn the predetermined maximum charge current rate, and when Rn>Rm and ΔR/Rm exceeds a threshold value, determining that the sampling point is the second characteristic point 322, wherein the threshold value is from 0.1 to 5.

Additionally, the method of selecting the first cutting-off point 312 can also be: in the open circuit condition, a ratio (ΔV/ΔAh)n of a voltage difference (ΔV) and an electric capacity difference (ΔAh) at a sampling point and a ratio (ΔV/ΔAh)m of a voltage difference (ΔV) and an electric capacity difference (ΔAh) at a reference residual capacity are calculated, and the current sampling point corresponding to a ratio of the two ratios (ΔV/ΔAh)n and (ΔV/ΔAh)m greater than a threshold value (Y) is used as the first characteristic point 312, wherein the threshold value (Y) is from 1.1 to 5. At the same time, the method of selecting the second characteristic point 322 includes: at the predetermined maximum charge current rate, a ratio (ΔV/ΔAh)n of a voltage difference (ΔV) and an electric capacity difference (ΔAh) at a sampling point and a ratio (ΔV/ΔAh)m of a voltage difference (ΔV) and an electric capacity difference (ΔAh) at a reference residual capacity are calculated, and the sampling point corresponding to a ratio of the two ratios (ΔV/ΔAh)n and (ΔV/ΔAh)m greater than a threshold value (Y) is used as the second characteristic point, wherein the threshold value (Y) is from 1.1 to 5.

That is, in an embodiment of the present disclosure, a point with the ratio (ΔV/ΔAh)n increased by 10% to 400% relative to the reference value (ΔV/ΔAh)m can be selected as a characteristic point (312, 322). In this embodiment, the reference residual capacity is, for example, a residual capacity between 0% and 100%, and preferably a residual capacity of 50%.

In addition, a characteristic boundary line 330 is established, the characteristic boundary line 330 passes the first characteristic point 312 and the second characteristic point 322, and the first characteristic curve 310, the second characteristic curve 320, and the characteristic boundary line 330 define an operation range. Subsequently, the battery is charged under at least one charge current rate according to a charge characteristic curve 302. The charge characteristic curve 302 falls within the operation range. In other words, the establishment of the characteristic boundary line in the present disclosure can be applied in the discharge mode of the battery and can also be applied in the charge mode of the battery.

Additionally, a maximum charge power (Pmax) of the battery at the sampling point K1 is:

$$P\max = \operatorname{Min}\begin{cases} I\max \times (OCVk + I\max \times Rk) \\ \dfrac{(Yk - OCVk)}{Rk} \times Yk \end{cases}$$

where Min is a smaller value, Imax is a current value of the battery at the predetermined maximum charge rate, OCVk is an open circuit voltage value of the battery at the electric capacity of the sampling point K1, Rk is a battery internal resistance at the sampling point K1, Yk is a voltage value corresponding to the characteristic boundary line 330 at the electric capacity of the sampling point K1.

In this embodiment, the characteristic boundary line 330 depicted in FIG. 4 can also be established in other modes. For example, the method of establishing the characteristic boundary line 330 further includes the following steps. A relationship between a voltage and an electric capacity of the battery at least one charge current rate is measured, so as to obtain at least a third characteristic curve 340, and a charge current rate of the third characteristic curve 340 is smaller than the predetermined maximum charge current rate. Next, a third characteristic point 342 is selected from the third characteristic curve 340, and the characteristic boundary line 330 passes the third characteristic point 342. In other words, in this embodiment, in addition to the first characteristic point 312 and the second characteristic point 322, the third characteristic point 342 can further be used to define the characteristic boundary line 330.

In an embodiment, the method of selecting the third characteristic point 342 includes calculating a difference quantity ΔR of a battery internal resistance (Rn) at a sampling point and a battery internal resistance (Rm) at a reference residual capacity when the battery is charged jn at least one charge current rate, and when Rn>Rm and ΔR/Rm exceeds a threshold value, determining the sampling point as the third characteristic point 342, wherein the threshold value is from 0.1 to 5. Alternatively, the third characteristic point 342 can be defined as follows: at the at least a charge current rate, a ratio (ΔV/ΔAh)n of a voltage difference (ΔV) and an electric capacity difference (ΔAh) at a sampling point and a ratio ($\Delta V/\Delta Ah$)m of a voltage difference ($\Delta V$) and an electric capacity difference ($\Delta Ah$) at a reference residual capacity are calculated, and the sampling point with a ratio of the two ratios ($\Delta V/\Delta Ah$)n and ($\Delta V/\Delta Ah$)m greater than a threshold value (Y) is used as a third characteristic point 342, wherein the threshold value (Y) is from 1.1 to 5. It is worth noting that the reference residual capacity can be a residual capacity between 0% and 100%, or a residual capacity of 50%.

In addition, the method of establishing the characteristic boundary line 330 can further include establishing a plurality of characteristic boundary lines 330 at different operation temperatures, so as to select one of the characteristic boundary lines 330 according to a practical operation temperature to properly define the operation range. On the characteristic boundary line 330, a charge current (I) and an electric capacity (Q) of the battery, for example, satisfy a linear function $Q(T,I)=c(T)I+d(T)$, where $c(T)$ and $d(T)$ are functions of a temperature. Additionally, the method of determining the battery charge mode further includes measuring a measured electric capacity when the battery stops charging. It is judged that whether the measured electric capacity value is the same as a calculated electric capacity value calculated through the linear function $Q(T,I)$. When the measured electric capacity value and the calculated electric capacity value are different, a ratio of the measured electric capacity value and the calculated electric capacity value is regarded as an update factor t, and $c(T)$ and $d(T)$ are respectively updated into $c(T) \times t$ and $d(T) \times t$. On the whole, in this embodiment, the measures described in the above embodiments can be applied in the charge process of the battery, so as to clearly observe the status of the battery and estimate a usable degree of the battery.

In view of the above, in the present disclosure, characteristic curves obtained during battery charging/discharging in a constant current are first measured, and characteristic points are selected from the characteristic curves, so as to establish a characteristic boundary line. Also, the battery is enabled to perform charging/discharging in the operation range defined by the characteristic curves and the characteristic boundary line. In such a manner, sudden voltage change does not occur during battery charging/discharging, thus facilitating to avoid aging of the battery. Additionally, a usable electric capacity of the battery can be estimated through the characteristic boundary line, so a user can correctly know a status of the battery. Of course, the user can also estimate a maximum dischargeable power and a maximum chargeable power of the battery according to distribution of the characteristic boundary lines, which are used as references for judging whether to use the battery.

In addition, although the implementation of the present disclosure is mainly illustrated in terms of the discharge process, the description of the charge process is simplified in order to avoid excessive repetition. Persons skilled in the art can define the whole implementation of the charge process through the method of the discharge process.

The technical content of the present disclosure has been disclosed through the embodiments, but is not intended to be limited thereto. Various variations and modifications made by persons skilled in the art without departing from the spirit and scope of the present disclosure shall fall within the scope of the present disclosure as defined by the appended claims.

What is claimed is:

1. A method for checking and modulating capacity and power based on battery charging/discharging characteristics, comprising:

measuring a relationship between an open circuit voltage and an output electric capacity of a battery to obtain a first characteristic curve;

measuring a relationship between a voltage and the output electric capacity of the battery at a predetermined maximum discharge current rate to obtain a second characteristic curve;

selecting a first characteristic point and a second characteristic point from the first characteristic curve and the second characteristic curve respectively, wherein a voltage value corresponding to the first characteristic point is higher than a voltage value corresponding to the second characteristic point;

establishing a characteristic boundary line passing the first characteristic point and the second characteristic point, wherein the first characteristic curve, the second characteristic curve, and the characteristic boundary line constitute a battery discharge boundary line to define an operation range; and managing the battery discharge within a discharge voltage range according to the output electric capacity of the battery, so as to keep a voltage-capacity curve falling within the operation range.

2. The method for checking and modulating capacity and power based on battery charging/discharging characteristics according to claim 1, wherein the characteristic boundary line is substantially a straight line or a curve passing the first characteristic point and the second characteristic point.

3. The method for checking and modulating capacity and power based on battery charging/discharging characteristics according to claim 1, wherein a difference between an output electric capacity value at the first characteristic point and an output electric capacity value obtained by an integration of a current is a residual capacity of the battery.

4. The method for checking and modulating capacity and power based on battery charging/discharging characteristics according to claim 1, wherein a difference between an output electric capacity value at the second characteristic point and an output electric capacity value obtained by an integration of a current is a usable capacity of the battery at the predetermined maximum discharge current rate.

5. The method for checking and modulating capacity and power based on battery charging/discharging characteristics according to claim 1, wherein a method of selecting the first characteristic point comprises:

in an open circuit condition, measuring or calculating a resistance difference $\Delta R$ of the battery bewteen an internal resistance (Rn) at a sampling point and an internal resistance (Rm) of the battery at a reference residual capacity; and when Rn>Rm and $\Delta R/Rm$ exceeds a threshold value, determining that the sampling point is the first characteristic point, wherein the threshold value is from 0.1 to 5.

6. The method for checking and modulating capacity and power based on battery charging/discharging characteristics according to claim 1, wherein a method of selecting the second characteristic point comprises:

at the predetermined maximum discharge current rate, measuring or calculating a resistance difference $\Delta R$ between an internal resistance (Rn) at a sampling point and an internal resistance (Rm) of the battery at a reference residual capacity; and when Rn>Rm and $\Delta R/Rm$ exceeds a threshold value, determining that the sampling point is the second characteristic point, wherein the threshold value is from 0.1 to 5.

7. The method for checking and modulating capacity and power based on battery charging/discharging characteristics according to claim 1, wherein a method of selecting the first characteristic point comprises:

in an open circuit condition, calculating a ratio $(\Delta V/\Delta Ah)n$ of a voltage difference $(\Delta V)$ and an output electric capacity difference $(\Delta Ah)$ of the battery at a sampling point and a ratio $(\Delta V/\Delta Ah)m$ of a voltage difference $(\Delta V)$ and an output electric capacity difference $(\Delta Ah)$ of the battery at a reference residual capacity, wherein the sampling point corresponding to a ratio of the two ratios $(\Delta V/\Delta Ah)n$ and $(\Delta V/\Delta Ah)m$ greater than a threshold value (Y) is used as the first characteristic point, and the threshold value (Y) is from 1.1 to 5.

8. The method for checking and modulating capacity and power based on battery charging/discharging characteristics according to claim 1, wherein a method of selecting the second characteristic point comprises:

at the predetermined maximum discharge current rate, calculating a ratio $(\Delta V/\Delta Ah)n$ of a voltage difference $(\Delta V)$ and an output electric capacity difference $(\Delta Ah)$ of the battery at a sampling point and a ratio $(\Delta V/\Delta Ah)m$ of a voltage difference $(\Delta V)$ and an output electric capacity difference $(\Delta Ah)$ of the battery at a reference residual capacity, wherein the sampling point corresponding to a ratio of the two ratios $(\Delta V/\Delta Ah)n$ and $(\Delta V/\Delta Ah)m$ greater than a threshold value (Y) is used as the second characteristic point, and the threshold value (Y) is from 1.1 to 5.

9. The method for checking and modulating capacity and power based on battery charging/discharging characteristics according to any one of claims 5 to 8, wherein the reference residual capacity is a residual capacity between 0% and 100%.

10. The method for checking and modulating capacity and power based on battery charging/discharging characteristics according to claim 1, wherein the discharge characteristic curve partially overlaps the characteristic boundary line.

11. The method for checking and modulating capacity and power based on battery charging/discharging characteristics according to claim 1, wherein a method of establishing the characteristic boundary line further comprises:

measuring the relationship between the voltage and the output electric capacity of the battery at the at least a discharge current rate to obtain at least a third characteristic curve, wherein the discharge current rate of the third characteristic curve is smaller than the predetermined maximum discharge current rate; and selecting a third characteristic point from the third characteristic curve, and making the characteristic boundary line pass the third characteristic point.

12. The method for checking and modulating capacity and power based on battery charging/discharging characteristics according to claim 11, wherein a method of selecting the third characteristic point comprises:

at the at least a discharge current rate, calculating a difference quantity $\Delta R$ between an internal resistance (Rn) of the battery at a sampling point and an internal resistance (Rm) of the battery at a reference residual capacity; and when Rn>Rm and $\Delta R/Rm$ exceeds a threshold value, determining the sampling point as the third characteristic point, wherein the threshold value is from 0.1 to 5.

13. The method for checking and modulating capacity and power based on battery charging/discharging characteristics according to claim 11, wherein a method of selecting the third characteristic point comprises:

at the at least a discharge current rate, calculating a ratio $(\Delta V/\Delta Ah)n$ of a voltage difference $(\Delta V)$ and an output electric capacity difference $(\Delta Ah)$ of the battery at a sampling point and a ratio $(\Delta V/\Delta Ah)m$ of a voltage difference $(\Delta V)$ and an output electric capacity difference $(\Delta Ah)$ of the battery at a reference residual capacity, wherein the sampling point corresponding to a ratio between the two ratios $(\Delta V/\Delta Ah)n$ and $(\Delta V/\Delta Ah)m$ greater than a threshold value (Y) is used as the third characteristic point, and the threshold value (Y) is between 1.1 and 5.

14. The method for checking and modulating capacity and power based on battery charging/discharging characteristics according to claim 12 or 13, wherein the reference residual capacity is a residual capacity between 0% and 100%.

15. The method for checking and modulating capacity and power based on battery charging/discharging characteristics according to claim 1, wherein a method of establishing the characteristic boundary line further comprises establishing a plurality of characteristic boundary lines at different operation temperatures and selecting one of the characteristic boundary lines at different operation temperatures according to a practical operation temperature to define the operation range.

16. The method for checking and modulating capacity and power based on battery charging/discharging characteristics according to claim 1, wherein on the characteristic boundary line, a discharge current(I) and an output electric capacity (Q) of the battery satisfy a linear function: $Q=a(T)I+b(T)$, and a and b change with a temperature.

17. The method for checking and modulating capacity and power based on battery charging/discharging characteristics according to claim 16, further comprising:

measuring a measured output electric capacity when the battery stops discharging;

judging whether the measured output electric capacity value is the same as a calculated output electric capacity value calculated through the linear function; and when the measured output electric capacity value and the calculated output electric capacity value are different, regarding a ratio of the measured output electric capacity value and the calculated output electric capacity value as an update factor t, and updating $a(T)$ and $b(T)$ respectively into $a(T) \times t$ and $b(T) \times t$.

18. A method for checking and modulating capacity and power based on battery charging/discharging characteristics, comprising:

measuring a relationship between an open circuit voltage and an electric capacity of a battery to obtain a first characteristic curve;

measuring a relationship between a voltage and the electric capacity of the battery at a predetermined maximum charge current rate to obtain a second characteristic curve;

selecting a first characteristic point and a second characteristic point from the first characteristic curve and the second characteristic curve respectively, wherein a voltage value corresponding to the first characteristic point is lower than a voltage value corresponding to the second characteristic point;

establishing a characteristic boundary line passing the first characteristic point and the second characteristic point, wherein the first characteristic curve, the second characteristic curve, and the characteristic boundary line constitute a battery charge boundary line to define an operation range; and charging the battery at least a charge current rate according to a charge characteristic curve, wherein the charge characteristic curve falls within the operation range.

19. The method for checking and modulating capacity and power based on battery charging/discharging characteristics according to claim 18, wherein the characteristic boundary line is substantially a straight line or a curve passing the first characteristic point and the second characteristic point.

20. The method for checking and modulating capacity and power based on battery charging/discharging characteristics according to claim 18, wherein a difference between an electric capacity value corresponding to the first characteristic point and an electric capacity value obtained by an integration of a current is a residual capacity of the battery.

21. The method for checking and modulating capacity and power based on battery charging/discharging characteristics according to claim 18, wherein a difference between an electric capacity value corresponding to the second characteristic point and an electric capacity value obtained by an integration of a current is a usable capacity of the battery at the predetermined maximum charge current rate.

22. The method for checking and modulating capacity and power based on battery charging/discharging characteristics according to claim 18, wherein a method of selecting the first characteristic point comprises:
    calculating or measuring a difference quantity $\Delta R$ between an internal resistance (Rn) of the battery at a sampling point and an internal resistance (Rin) of the battery at a reference residual capacity in an open circuit condition; and
    when Rn>Rm and $\Delta R/Rm$ exceeds a threshold value, determining that the sampling point is the first characteristic point, wherein the threshold value is from 0.1 to 5.

23. The method for checking and modulating capacity and power based on battery charging/discharging characteristics according to claim 18, wherein a method of selecting the second characteristic point comprises:
    at the predetermined maximum charge current rate, calculating or measuring a difference quantity $\Delta R$ between an internal resistance (Rn) of the battery at a sampling point and an internal resistance (Rm) of the battery at a reference residual capacity; and
    when Rn>Rm and $\Delta R/Rm$ exceeds a threshold value, determining that the sampling point is the second characteristic point, wherein the threshold value is from 0.1 to 5.

24. The method for checking and modulating capacity and power based on battery charging/discharging characteristics according to claim 18, wherein a method of selecting the first characteristic point comprises:
    in an open circuit condition, calculating a ratio $(\Delta V/\Delta Ah)n$ of a voltage difference ($\Delta V$) and an electric capacity difference ($\Delta Ah$) of the battery at a sampling point and a ratio $(\Delta V/\Delta Ah)m$ of a voltage difference ($\Delta V$) and an electric capacity difference ($\Delta Ah$) of the battery at a reference residual capacity, wherein the sampling point corresponding to a ratio of the two ratios $(\Delta V/\Delta Ah)n$ and $(\Delta V/\Delta Ah)m$ greater than a threshold value (Y) is used as the first characteristic point, and the threshold value (Y) is from 1.1 to 5.

25. The method for checking and modulating capacity and power based on battery charging/discharging characteristics according to claim 18, wherein the selecting the second characteristic point comprises:
    at the predetermined maximum charge current rate, calculating a ratio $(\Delta V/\Delta Ah)n$ of a voltage difference ($\Delta V$) and an electric capacity difference ($\Delta Ah$) of the battery at a sampling point and a ratio $(\Delta V/\Delta Ah)m$ of a voltage difference ($\Delta V$) and an electric capacity difference ($\Delta Ah$) of the battery at a reference residual capacity, wherein the sampling point corresponding to a ratio between the two ratios $(\Delta V/\Delta Ah)n$ and $(\Delta V/\Delta Ah)m$ greater than a threshold value (Y) is used as the second characteristic point, and the threshold value (Y) is from 1.1 to 5.

26. The method for checking and modulating capacity and power based on battery charging/discharging characteristics according to any one of claims 22 to 25, wherein the reference residual capacity is a residual capacity between 0% and 100%.

27. The method for checking and modulating capacity and power based on battery charging/discharging characteristics according to claim 18, wherein the charge characteristic curve partially overlaps the characteristic boundary line.

28. The method for checking and modulating capacity and power based on battery charging/discharging characteristics according to claim 18, wherein a method of establishing the characteristic boundary line further comprises:
    measuring the relationship between the voltage and the electric capacity of the battery at least a discharge current rate to obtain at least a third characteristic curve, wherein the charge current rate of the third characteristic curve is smaller than the predetermined maximum charge current rate; and
    selecting a third characteristic point from the third characteristic curve, and making the characteristic boundary line pass the third characteristic point.

29. The method for checking and modulating capacity and power based on battery charging/discharging characteristics according to claim 18, wherein a method of selecting the third characteristic point comprises:
    at the at least a charge current rate, calculating a difference quantity $\Delta R$ between an internal resistance (Rn) of the battery at a sampling point and an internal resistance (Rin) of the battery at a reference residual capacity; and
    when Rn>Rm and $\Delta R/Rm$ exceeds a threshold value, determining the sampling point as the third characteristic point, wherein the threshold value is from 0.1 to 5.

30. The method for checking and modulating capacity and power based on battery charging/discharging characteristics according to claim 18, wherein a method of selecting the third characteristic point comprises:
    at the at least a charge current rate, calculating a ratio $(\Delta V/\Delta Ah)n$ of a voltage difference ($\Delta V$) and an electric capacity difference ($\Delta Ah$) of the battery at a sampling point and a ratio $(\Delta V/\Delta Ah)m$ of a voltage difference ($\Delta V$) and an electric capacity difference ($\Delta Ah$) of the battery at a reference residual capacity, wherein the sampling point corresponding to a ratio of the two ratios $(\Delta V/\Delta Ah)n$ and $(\Delta V/\Delta Ah)m$ greater than a threshold value (Y) is used as the third characteristic point, and the threshold value (Y) is from 1.1 to 5.

31. The method for checking and modulating capacity and power based on battery charging/discharging characteristics according to claim 29 or 30, wherein the reference residual capacity is a residual capacity between 0% and 100%.

32. The method for checking and modulating capacity and power based on battery charging/discharging characteristics according to claim 18, wherein a method of establishing the characteristic boundary line further comprises establishing a plurality of characteristic boundary lines at different operation temperatures and selecting one of the characteristic boundary lines at different operation temperatures according to a practical operation temperature to define the operation range.

33. The method for checking and modulating capacity and power based on battery charging/discharging characteristics according to claim 18, wherein on the characteristic boundary line, a charge current (I) and the electric capacity (Q) of the battery satisfy a linear function: Q=c(T)I+d(T), and c and d change with a temperature.

34. The method for checking and modulating capacity and power based on battery charging/discharging characteristics according to claim 33, further comprising:
measuring measured electric capacity when the battery stops charging;
judging whether the measured electric capacity value is the same as a calculated electric capacity value calculated through the linear function; and
when the measured electric capacity value is different from the calculated electric capacity value, regarding a ratio of the measured electric capacity value and the calculated electric capacity value as an update factor t, and updating c(T) and d(T) respectively into c(T)×t and d(T)×t.

35. A method for checking and modulating capacity and power based on battery charging/discharging characteristics, comprising:
measuring a relationship between an open circuit voltage and an output electric capacity of a battery to obtain a first characteristic curve;
measuring a relationship between a voltage and the output electric capacity of the battery at a predetermined maximum discharge current rate to obtain a second characteristic curve;
selecting a first characteristic point and a second characteristic point from the first characteristic curve and the second characteristic curve respectively, wherein a voltage value corresponding to the first characteristic point is higher than a voltage value corresponding to the second characteristic point;
establishing a characteristic boundary line passing the first characteristic point and the second characteristic point, wherein the first characteristic curve, the second characteristic curve, and the characteristic boundary line define an operation range;
discharging the battery at least a discharge current rate according to a discharge characteristic curve, wherein the discharge characteristic curve falls within the operation range;
calculating a difference between an output electric capacity value corresponding to the first characteristic point and an output electric capacity value obtained by an integration of a current to obtain a residual capacity of the battery; and
calculating a difference between an output electric capacity value corresponding to the second characteristic point and an output electric capacity value obtained by an integration of the current to obtain a usable capacity of the battery at the predetermined maximum discharge current rate.

36. The method for checking and modulating capacity and power based on battery charging/discharging characteristics according to claim 35, wherein a maximum discharge power (Pmax) of the battery at a sampling point is:

$$P\max = \operatorname{Min} \left\{ \begin{array}{l} I\max \times (OCVk - I\max \times Rk) \\ \dfrac{(OCVk - Yk)}{Rk} \times Yk \end{array} \right.$$

Min is the smaller value of the two associated values, Imax is a current value of the battery at the predetermined maximum discharge rate, OCVk is an open circuit voltage value of the battery at an output electric capacity of the sampling point, Rk is an internal resistance of the battery at the sampling point, and Yk is a voltage value corresponding to the characteristic boundary line of the battery at the output electric capacity of the sampling point.

37. A method for checking and modulating capacity and power based on battery charging/discharging characteristics, comprising:
measuring a relationship between an open circuit voltage and an electric capacity of a battery to obtain a first characteristic curve;
measuring a relationship between a voltage and the electric capacity of the battery at a predetermined maximum charge current rate to obtain a second characteristic curve;
selecting a first characteristic point and a second characteristic point from the first characteristic curve and the second characteristic curve respectively, wherein a voltage value corresponding to the first characteristic point is lower than a voltage value corresponding to the second characteristic point;
establishing a characteristic boundary line passing the first characteristic point and the second characteristic point, wherein the first characteristic curve, the second characteristic curve, and the characteristic boundary line define an operation range;
charging the battery in at least a charge current rate according to a charge characteristic curve, wherein the charge characteristic curve falls within the operation range;
calculating a difference between an output electric capacity value corresponding to the first cutting-off point and an output electric capacity value obtained by an integration of the current to obtain a residual capacity of the battery; and
calculating a difference between an output electric capacity value corresponding to the second cutting-off point and the output electric capacity value obtained by an integration of the current to obtain a usable capacity of the battery at the predetermined maximum charge current rate.

38. The method for checking and modulating capacity and power based on battery charging/discharging characteristics according to claim 37, wherein a maximum charge power (Pmax) of the battery at a sampling point is:

$$P\max = \operatorname{Min} \left\{ \begin{array}{l} I\max \times (OCVk + I\max \times Rk) \\ \dfrac{(Yk - OCVk)}{Rk} \times Yk \end{array} \right.$$

Min is the smaller value of the two associated values, Imax is a current value of the battery at the predetermined maximum charge rate, OCVk is an open circuit voltage value of the battery at an electric capacity of the sampling point, Rk is an internal resistance of the battery at the sampling point, and Yk is a voltage value corresponding to the characteristic boundary line of the battery at the electric capacity of the sampling point.

* * * * *